United States Patent [19]

Hall et al.

[11] 3,836,825

[45] Sept. 17, 1974

[54] HEAT DISSIPATION FOR POWER INTEGRATED CIRCUIT DEVICES

[75] Inventors: William Bernard Hall, Stockton; Joseph Allen Koskulitz, Raritan, both of N.J.

[73] Assignee: RCA Corporation, New York, N.Y.

[22] Filed: Oct. 6, 1972

[21] Appl. No.: 295,536

[52] U.S. Cl............ 317/100, 317/234 A, 174/DIG.5
[51] Int. Cl................................................ H01l 1/12
[58] Field of Search...... 174/52 PE, DIG. 5, DIG. 3; 317/100, 234, 1, 3

[56] References Cited

UNITED STATES PATENTS

| | | | |
|---|---|---|---|
| 3,290,564 | 12/1966 | Wolff | 174/52 S |
| 3,560,808 | 2/1971 | Segerson | 174/DIG. 3 |
| 3,644,798 | 2/1972 | Ihochi | 317/234 |
| 3,646,409 | 2/1972 | Van de Water | 174/52 PE |
| 3,665,256 | 5/1972 | Goun | 317/100 |

OTHER PUBLICATIONS

IBM Tech. Discl. Bvl., Integrated Circuit Component, Arnold and Cherniack, Vol. 12, No. 6, Nov. 1969.

*Primary Examiner*—Robert K. Schaefer
*Assistant Examiner*—Gerald P. Tolin
*Attorney, Agent, or Firm*—H. Christoffersen; R. P. Williams

[57] ABSTRACT

An integrated circuit chip having circuit elements capable of relatively high power operation is encapsulated in a body of polymeric material having the form of an elongated prism. Conductors are electrically coupled to the circuit elements in the chip and extend outwardly of the body through a relatively long side thereof. A heat conducting stud is anchored in the body and is thermally coupled to the chip. The stud extends outwardly of the package through another of its relatively long sides. A heat sink may be coupled to the stud outside of the package.

6 Claims, 6 Drawing Figures

PATENTED SEP 17 1974

3,836,825

HEAT DISSIPATION FOR POWER INTEGRATED CIRCUIT DEVICES

BACKGROUND OF THE INVENTION

The present invention relates to the encapsulation of semiconductor devices such as integrated circuit devices. More particularly, the invention relates to a package for an integrated circuit device which is capable of operation at relatively high power levels and to an assembly of such a package with a heat dispersing means.

Integrated circuit chips have heretofore been encapsulated in three basic kinds of package. One is a metal can similar to the can conventionally used for discrete transistors, and another is a package made of an assembly of ceramic elements. Both of these packages have relatively high efficiencies of thermal transfer from the semiconductor active device within them to the exterior. They are, however, relatively expensive and contribute greatly to the cost of manufacture of the product.

In the third kind of package, the integrated circuit chips are embedded in polymeric plastic material. This kind of package has found wide acceptance because of its relatively low cost.

Conventional manufacture of plastic packages begins with the production of a so-called lead frame which consists generally of a co-planar assembly of a supporting pad for a semiconductor device and a plurality of leads adapted to be electrically coupled to the semiconductor device, all held together in their intended relative positions by means of interconnecting metal bars or strips, which are later to be removed. The lead frame is usually stamped from a flat sheet of metal. A semiconductor device such as an integrated circuit chip is then mounted on the supporting pad and connections are established by means of fine wires between the active elements on the chip and the leads on the lead frame. This assembly is then placed in a mold, such as a transfer mold, and polymeric material is introduced into the mold to encapsulate the chip. After the polymeric material has hardened, the package is removed from the mold and the excess metal on the lead frame is cut off. The resulting leads may then be bent or "formed" into the so-called dual-in-line relation.

As used particularly for integrated circuits, the finished package produced by the process described in the foregoing paragraph is a body of polymeric material having the form of an elongated prism within which is an integrated circuit chip mounted on a metal pad. Leads extend from two of the relatively long sides of the body. Since the polymeric materials which have been employed for plastic semiconductor device packaging have relatively low thermal conductivity characteristics, the packages have been adapted only for lower power operation. They are not suitable for many of the presently known integrated circuit devices which are capable of operation at relatively high power levels. Circuits are known, for example, which produce sufficient heat during operation to require a package having a thermal resistance of less than 10°C. per watt.

Some known plastic packages for integrated circuit devices include means to extract heat from the chip. One such package includes all the structure described above, and in addition has a relatively massive heat conductor coupled to the support pad for the integrated circuit chip. In the finished package, this heat conductor extends in the direction of elongation of the package and emerges from one of the relatively short ends thereof. This construction does improve the thermal characteristics of previously known plastic packages, but the heat conductor extends out of the packages along one of the longest and least thermally efficient paths. Another known package is described in U.S. Pat. No. 3,665,256, issued to Goun and Wheatley on May 23, 1972, and assigned to the same assignee as is the present application. In this package, heat is extracted from a chip through a heat conductor formed as part of the lead frame and extending out of the package through a short path. While this package is quite satisfactory, its thermal resistance is still somewhat too high for many applications.

A known plastic package for relatively high power discrete semiconductor devices has a somewhat rectangular plastic body with a coplanar set of electrical leads and a thermal lead extending therefrom. The electrical leads extend from one of the longer sides of the body and the thermal lead extends from the other. This package is satisfactory for devices such as transistors which have relatively few leads but would not be adequate for an integrated circuit having a substantial number of electrical leads associate therewith. The efficient use of space in integrated circuit packages requires that electrical leads extend from two opposite long sides of the device.

THE DRAWINGS

THE PREFERRED EMBODIMENTS

Figure 1:
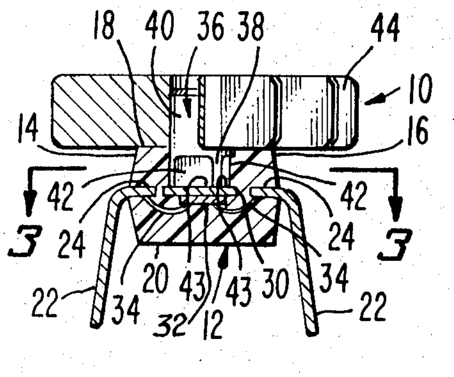
FIG. 1 is a cross sectional view, partly in elevation, taken on the line 1—1 of FIG. 2, of one form of the present novel package.
Figure 2:
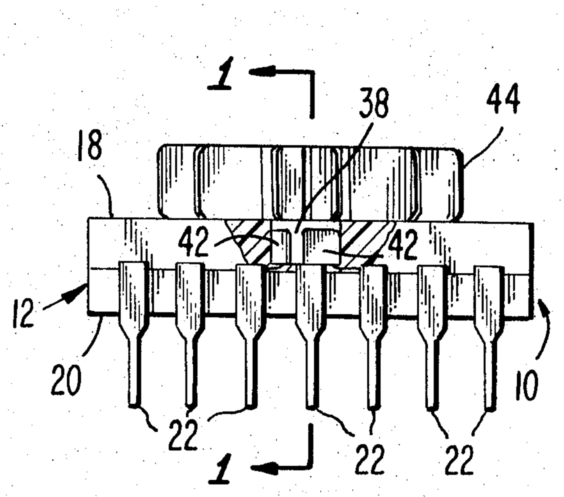
FIG. 2 is a side view, partly in section, of the package shown in FIG. 1.
Figure 3:
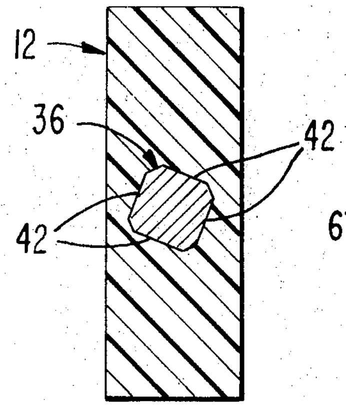
FIG. 3 is a cross sectional view taken on the line 3—3 of FIG. 1.

One form of the present novel integrated circuit package is shown at 10 in FIGS. 1 and 2. The package 10 includes a body 12 of polymeric material, such as a moldable epoxy plastic, which has a pair of side surfaces 14 and 16, a top surface 18, and a bottom surface 20. As is conventional, the side surfaces 14 and 16 are sloped slightly outwardly from each of the top and bottom surfaces 18 and 20 to aid in removing the package 10 from the mold in which the body 12 is formed. However, the body 12 is substantially a rectangular prism and the top and bottom surfaces are substantially at right angles to the side surfaces.

A plurality of electrical leads 22 emerge from the body 12 through the side surfaces 14 and 16 thereof and have portions 24 (FIG. 1) disposed inside the body in parallel relationship to a given plane which is substantially normal to the surfaces 14 and 16. The leads 22 may once have been a part of a conventional lead frame. Also, within the body 12 is a chip supporting pad 30 which like the leads 22 may have been part of a lead frame. A semiconductor chip 32 is mounted on the pad 30 in such a manner as to be thermally coupled therewith. For this purpose, it may be soldered to the pad 30 or attached to the pad 30 by means of a heat conductive adhesive. Wires 34 connect the active circuit elements on the chip 32 to the leads 22.

A heat conductive stud 36, which preferably has the form of a right circular cylinder of relatively large diameter compared to the dimensions of the package, is thermally coupled to the chip 32. For example, the stud 36 may be soldered to the side of the pad 30 opposite from the side on which the chip 32 is attached. The stud 36 has a portion 38 thereof which is disposed inside the body 12 and a portion 40 thereof disposed outside the body 12. The axis of the stud 36 is substantially normal to the plane of the lead portions 24 and the pad 30 inside the body 12 so that the stud emerges from the top surface 18 of the body 12 in substantially perpendicular relation thereto.

Means are provided for anchoring the stud 36 in the body 12. In the embodiment of FIGS. 1 and 2, the anchoring means takes the form of a plurality of chordal flats 42 formed on that portion 38 of the stud 36 which is inside the body 12. Upon the formation of the body 12, the moldable plastic will surround the chordal flats 42 and, when it has cured, will firmly secure the stud 36 against rotation within the body 12. Moreover, the stud 36 is firmly attached to the pad 30 and the flats 42 will expose portions 43 of the surface of the pad 30. This arrangement firmly anchors the stud 36 against withdrawal from the body 12.

Heat dispersing means may be provided to aid in removing heat from the stud 36. For example, a radially finned radiator 44 may be soldered or force fit onto the portion 40 of the stud 36, as shown. Other forms of heat sinks such as convection type heat sinks may also be employed.

Figure 4:
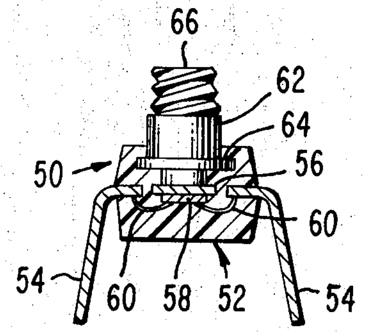
FIG. 4 is a cross sectional view of another form of the present novel package.

FIG. 4 illustrates at 50 a second form of the present novel package. The package 50 has a body 52 of polymeric material like the body 12 of the package 10 and includes leads 54, a chip supporting pad 56, a chip 58 and wires 60; all arranged in the same manner as the corresponding elements in the package 10.

The package 50 includes a thermally conductive stud 62 which generally has the form of a right circular cylinder like the stud 36. The stud 62 differs from the stud 36 in two respects, however. First, instead of a groove as the anchoring means, the stud 62 has a cylindrical flange 64 in that portion thereof which is inside the body 52. Second, the portion of the stud 62 which is outside the body 52 is provided with a threaded portion 66 to aid in attaching the package to a heat sink.

Figure 5:
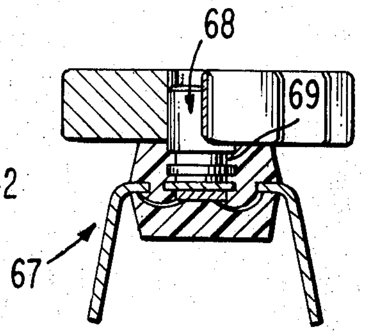
FIG. 5 is a cross sectional view of a third form of the present novel package.

FIG. 5 shows at 67 a third embodiment of the present package, which except for the stud, 68 in this embodiment, is constructed in the same manner as the other devices described above. A different anchoring means is used here, i.e. the stud 68 has at least one peripheral groove 69 in the portion of the stud 68 which is within the body.

Figure 6:
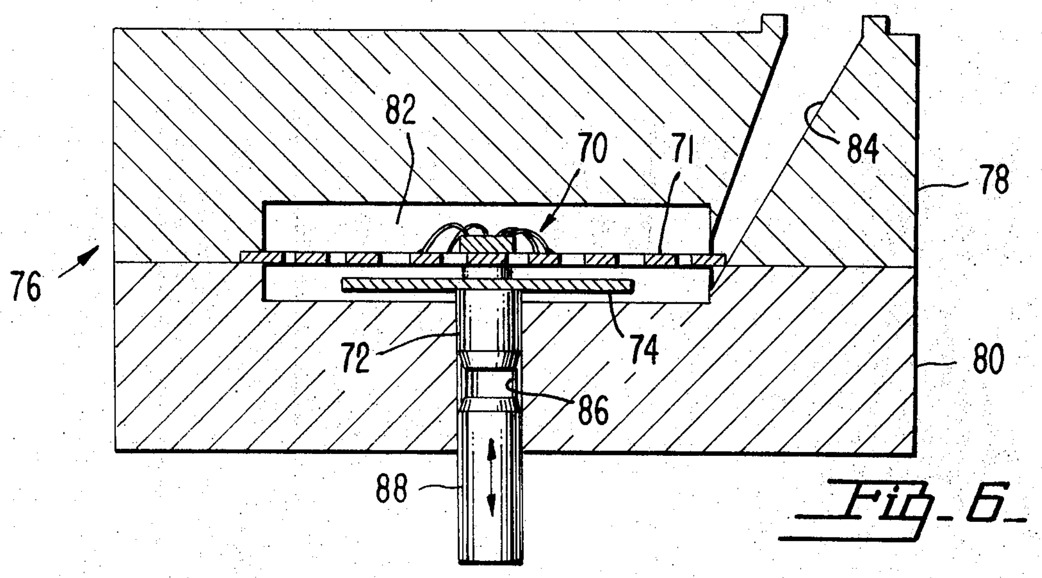
FIG. 6 is a diagrammatic representation of a transfer mold, in which some of the elements of a fourth form of the present package are disposed.

FIG. 6 is provided to show a fourth embodiment of the present package and to illustrate diagrammatically a structural feature of the present package which adapts this package especially for manufacture in conventional molding apparatus. The elements of this package which are shown are designated generally by the reference numeral 70, and these elements are similar to the elements of the other embodiments except that here the original flat lead frame, designated 71, is shown. There is a stud 72 in this embodiment which is provided with a different form of anchoring means. Here the anchoring means is a flat elongated plate 74 attached to that portion of the stud 72 which will be inside the plastic body of the package after it is formed. The plate 74 is elongated in the same direction as the body and this elongation tends to increase the mechanical strength of the anchoring and tends to resist, to a somewhat higher degree than the other embodiments, any mechanical leverage which may be imposed on the external portion of the stud 72.

The parts described are disposed in a conventional molding apparatus 76 which includes a mold half 78 and a mold half 80 which may be brought together to define a mold cavity 82. An inlet sprue 84 in the mold half 78 communicates with the cavity 82. A cylindrical bore 86 in the mold half 80 also communicates with the mold cavity 82. In conventional apparatus, a push-out pin 88 is provided which may be reciprocated axially in the bore 86 to eject a finished product from the mold after the mold is opened. The relation of the stud 72 to the other parts of the package and the diameter of the stud 72 are chosen such that the stud 72 will project into and fit closely within the bore 86 when the mold is closed. In this way, no tooling changes need be made in the molds in order to accommodate the present novel package.

In the final steps of manufacture of this package, the parts 70 are placed in the mold 76 with the stud 72 in the bore 86 and the mold is closed. Plastic material is then transferred in through the sprue 84 to form the body of the package. Once the plastic has set, the mold is opened and the push-out pin 88 is advanced to engage the stud 72 to press the package out of the mold. Conventional procedures of shearing the lead frame and forming the leads may then be done to complete the package. If it is desired to provide a radiator or other heat sink with the package, it may be attached at this time.

The present novel package provides an efficient mechanism for extracting heat from a plastic package and may provide a thermal dissipation of more than one watt per 10°C. The package may be fabricated in conventional molding apparatus without change thereto.

What is claimed is:

1. A plastic packaged semiconductor device having means for removing heat from within the package comprising:

an elongated, prismatic body of polymeric material having side surfaces, a plurality of leads emerging from a plurality of said side surfaces of said body and having portions inside and outside said body, that portion of each of said leads which is inside said body being parallel to a given plane, a chip-supporting pad within said body, said pad being coplanar with said portions of said leads inside said body, a heat conductive stud, having substantially the form of a right circular cylinder having an axis disposed substantially normal to said given plane, emerging from a surface of said body which is substantially at right angles to said side surfaces and having portions inside and outside said body, the portion of said stud inside said body being attached to and thermally coupled to one side of said pad, a semiconductor chip within said body, said chip being attached to and thermally coupled to the other side of said pad and electrically coupled to said leads, and means for anchoring said stud in said body.

2. A plastic packaged semiconductor device as defined in claim 1 wherein said anchoring means comprises a groove in the surface of that portion of said stud which is inside said body.

3. A plastic packaged semiconductor device as defined in claim 1 wherein said anchoring means comprises a cylindrical flange on that portion of said stud which is inside said body.

4. A plastic packaged semiconductor device as defined in claim 1 wherein said body is elongated and said anchoring means comprises a flat elongated plate attached to that portion of said stud which is inside said body, said plate being elongated in the same direction as said body.

5. A plastic packaged semiconductor device as defined in claim 1 further comprising:

heat sink means thermally coupled to that portion of said stud which is outside said body.

6. A plastic packaged semiconductor device as defined in claim 1, wherein said anchoring means comprises a plurality of chordal flats on that portion of said stud which is inside said body.

* * * * *